United States Patent
Ho et al.

(10) Patent No.: US 7,419,771 B2
(45) Date of Patent: Sep. 2, 2008

(54) METHOD FOR FORMING A FINELY PATTERNED RESIST

(75) Inventors: Bang-Chein Ho, Hsin-Chu (TW); Jian-Hong Chen, Hsin chu (TW)

(73) Assignee: Taiwan Semiconductor Manufacturing Co., Ltd., Hsin Chu (TW)

( * ) Notice: Subject to any disclaimer, the term of this patent is extended or adjusted under 35 U.S.C. 154(b) by 572 days.

(21) Appl. No.: 11/033,647

(22) Filed: Jan. 11, 2005

(65) Prior Publication Data

US 2006/0154185 A1   Jul. 13, 2006

(51) Int. Cl.
*G03F 7/26* (2006.01)
(52) U.S. Cl. .................. 430/322; 430/325; 430/330
(58) Field of Classification Search ................ 430/311, 430/322, 325, 330
See application file for complete search history.

(56) References Cited

U.S. PATENT DOCUMENTS

2001/0029107 A1 * 10/2001 Yamana ....................... 438/758
2005/0133827 A1 * 6/2005 Huang et al. ................. 257/213
2006/0134889 A1 * 6/2006 Sadra et al. .................. 438/473

* cited by examiner

*Primary Examiner*—Kathleen Duda
(74) *Attorney, Agent, or Firm*—Tung & Associates

(57) ABSTRACT

A method for reducing a critical dimension of a photoresist pattern while improving a line spacing between distal end portions of pattern lines wherein the method includes providing a substrate including an overlying resist; exposing the resist to an activating light source; baking the resist in a first baking process followed by developing the resist in a first development process to form a first resist pattern; then baking the first resist pattern in a second baking process followed by developing the first resist pattern in a second development process to form a second resist pattern having reduced dimensions; and, then dry trimming the second resist pattern to form a final resist pattern with reduced dimensions compared to the second resist pattern.

21 Claims, 5 Drawing Sheets

METHOD FOR FORMING A FINELY PATTERNED RESIST

FIELD OF THE INVENTION

This invention generally relates to resist patterning techniques in integrated circuit semiconductor device manufacturing processes and more particularly to an improved method for producing a finely patterned resist layer including improved control over critical dimensions (CD's) while improving pattern feature spacing and improving a process flow.

BACKGROUND OF THE INVENTION

One of the limiting factors in the continuing evolution toward smaller device semiconductor feature size and higher density has been the stringent requirements placed on photolithographic processes as line width and step heights have decreased. Various resist trimming method methods have been proposed in prior art processes to achieve more finely dimension patterns following a resist exposure and development process.

For example, several different process variables may contribute to unacceptable resist profiles. Typically a photoresist layer is applied to a semiconductor wafer surface, for example, by spin coating a resinous layer over the process surface followed by what is referred to as a 'soft bake' to impart structural stability to the photoresist layer. The photoresist layer is then aligned and exposed to activating light through a photomask after which the photoresist undergoes a post exposure baking (PEB) process to improve adhesion and to initiate catalyzed photoresist reactions in chemically amplified photoresists. For example, in many DUV photoresists, a photoacid generated during the exposure process is partially removed in the PEB process to remove a protecting group from the resin thereby rendering the exposed region of the photoresist soluble in a developer.

The temperature and time period of the PEB process is critical to CD control of developed resist profiles. Temperatures must typically be controlled to within about 0.1° C. to prevent CD variations due to undesirable photoresist chemical reactions.

In addition, the development process must be properly controlled to avoid additional factors adversely affecting resist profiles. For example, if the exposed resist region does not become fully soluble, resist profiles are compromised.

Various approaches have been proposed in the prior art for achieving acceptable pattern resolution in finely patterned resists, for example having a resist line width smaller than a wavelength of the exposing light source. Proposed methods have included dry etching or trimming the resist following development, a method which is increasingly limited due to difficulty in controlling the etching rate of resists to form a dimensioned pattern with the required critical dimensions.

In addition, the application of an additional overlayer of resist following development of an underlying resist has been proposed to further render soluble portions of the underlying resist to achieve a smaller underlying resist pattern. While this method has met with some success, the method requires the additional and time-consuming process steps of applying an additional layer of resist with associated baking and developing steps thereby increasing cost and reducing process wafer throughput. In addition, there is a relatively high incidence of defects due to uneven and over development.

There is therefore a need in the semiconductor device manufacturing art for improved resist patterning methods to allow smaller CD's to be achieved with reduced defects and with an improved process flow including increased process wafer throughput.

It is therefore an object of the invention to provide an improved resist patterning method to allow smaller CD's to be achieved with reduced detects and with an improved process flow including increased process wafer throughput, in addition to overcoming other shortcomings of the prior art.

SUMMARY OF THE INVENTION

To achieve the foregoing and other objects, and in accordance with the purposes of the present invention, as embodied and broadly described herein, the present invention provides a method for reducing a critical dimension of a photoresist pattern while improving line spacing.

In a first embodiment, the method includes providing a substrate including an overlying resist; exposing the resist to an activating light source; baking the resist in a first baking process followed by developing the resist in a first development process to form a first resist pattern; then baking the first resist pattern in a second baking process followed by developing the first resist pattern in a second development process to form a second resist pattern having reduced dimensions; and, then dry trimming the second resist pattern to form a final resist pattern with reduced dimensions compared to the second resist pattern.

These and other embodiments, aspects and features of the invention will be better understood from a detailed description of the preferred embodiments of the invention which are further described below in conjunction with the accompanying Figures.

DETAILED DESCRIPTION OF THE PREFERRED EMBODIMENTS

Although the present invention is explained with respect to, and particularly advantageous for, the formation of conductive interconnect lines in a multi-level integrated circuit semiconductor device, the method of the present invention may be used to achieve reduced CD sizes, for example, less than the wavelength of the exposing (illuminating) light in a lithographic process, for any type of resist pattern having an elongated shape, e.g., lines where a width portion is less than a length portion.

Figure 1A:
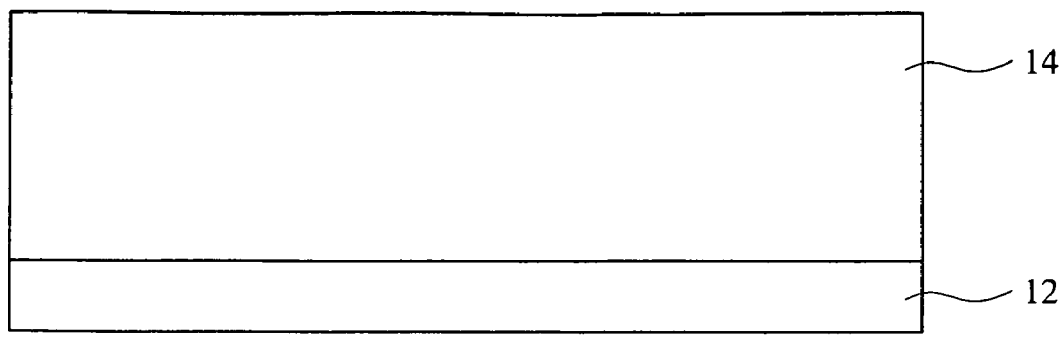
FIGS. 1A-1E are cross sectional views of an exemplary resist pattern at steps in manufacturing according to an embodiment of the present invention.

Referring to FIG. 1A is shown a portion of resist layer 14 overlying a portion of a substrate 12. It will be appreciated that the substrate may be any type of substrate including a dielectric insulating layer or a conductive layer for forming an elongated (e.g., line) pattern therein, e.g., damascene interconnect lines. Photoresist layer 14, in an important aspect of the invention is preferably a chemically amplified (CA) photoresist including a photoacid generator (PAG) acid. It will be appreciated that there are wide variety of commercially available photoresists including PAG's that are known in the art. For example, upon absorption of a photon of light of an appropriate energy (wavelength), an acid is generated throughout the photoresist. During a subsequent heating (baking) step a series of catalytic chemical reactions are initiated to make the photoresist more soluble (e.g., protecting group removed) in an appropriate developing process. Following application of the photoresist to the substrate surface, e.g., by a spin-on process, the photoresist may optionally undergo a first soft bake process at a temperature of at least 60° C. to drive off solvent and impart dimensional stability to the photoresist.

Figure 1B:
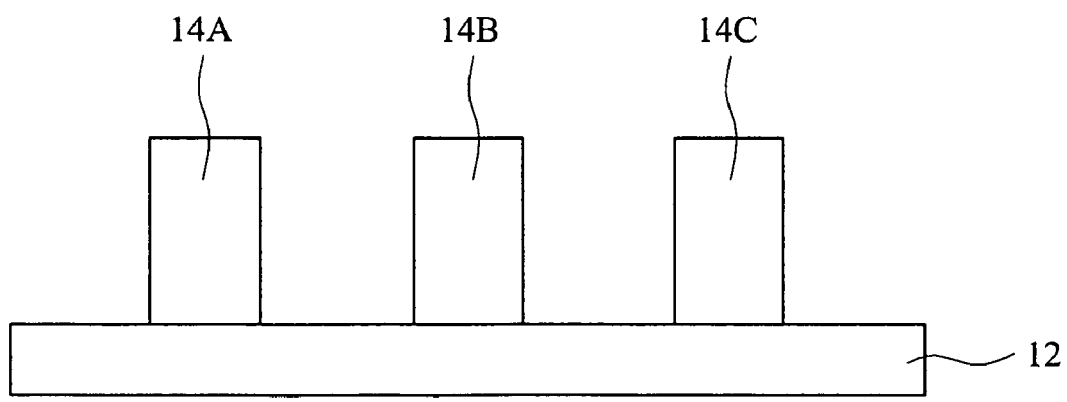

Referring to FIG. 1B, following exposure of the photoresist layer 14 to an appropriate wavelength of light, preferably deep ultraviolet (DUV), for example, including KrF (248 nm) or ArF (193 nm) or $F_2$ (157 nm) activating light sources, the resist is then heated in a conventional post exposure bake (PEB) process. For example the PEB process includes heating the backside of the process wafer on a hot plate at a temperature of at least 80° C. preferably between about 90° C. and about 140° C., depending on the particular photoresist. A conventional development process is then carried out. The developing process may include any developing solution and method of application, including an alkaline developing solution containing tetra methyl ammonium hydroxide (TMAH) to form the patterned resist portions e.g., 14A, 14B, and 14C. It will be appreciated that an after development (ADI) process is preferably carried out following the developing process, for example using a scanning electron microscope (SEM) or transmission electron microscope (TEM) to determine dimensions of the patterned resist portions.

Figure 1C:
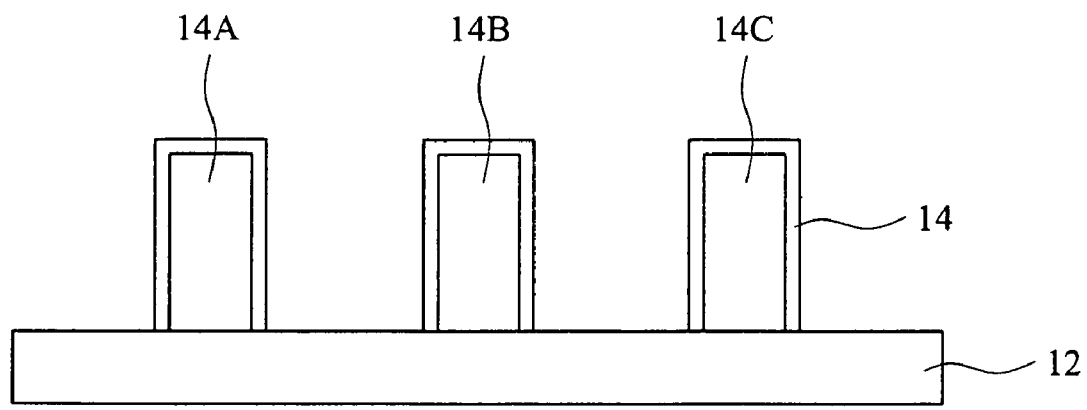

Referring to FIG. 1C, in an important aspect of the invention, following the PEB process, the patterned resist portions are subjected to a second baking process, preferably over a temperature of at least 100° C. and may include a temperature higher than the PEB process. In the second baking process, it has been found that residual acid species remaining in the resist portions act to further decompose chemical species (protecting groups) in a surface portion of the patterned resist portions e.g., 16, thereby rendering the surface portions e.g., 16 soluble in a subsequent developing process. Depending on the baking temperature and time of the first PEB treatment, it is believed that sufficient acid generated from the PAG during the exposure process remains in the patterned resist portions following the PEB and first development steps such that baking the patterned resist portions causes further chemical reaction to render surface portions of patterned resist portions soluble in a subsequent developing process.

Figure 1D:
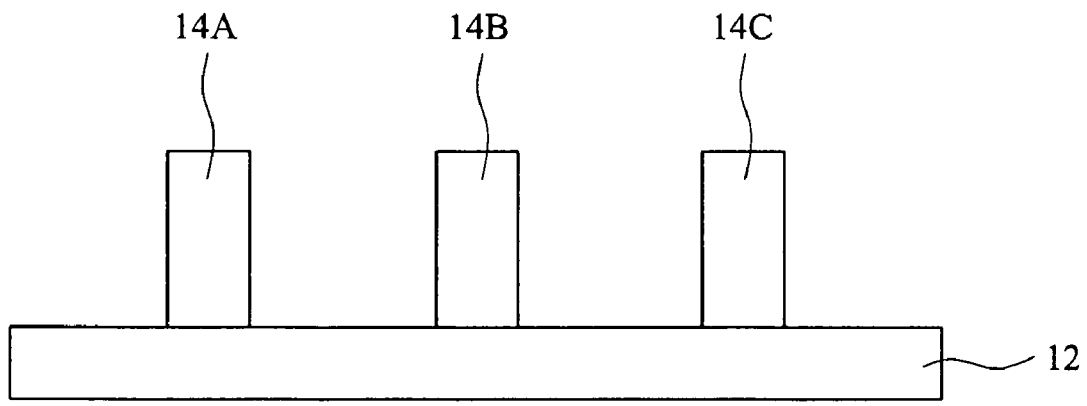

Referring to FIG. 1D, a second development process is then carried out on the baked patterned resist portions to remove additional portions e.g., surface portion 16 of the first patterned resist portions to form second (reduced dimension) second patterned resist portions e.g., 14A, 14B, and 14C. Preferably, the dimensions of the first patterned resist portions are substantially isotropically reduced e.g., by removing about equal surface portion thicknesses, preferably including at least a line length and width. For example, according to an aspect of the invention, at least a critical dimension (e.g., linewidth) and a line length of the first patterned resist portions are reduced at about a 1:1 ratio.

It will be appreciated that the amount of additional resist removed in the second developing step will partially depend on the temperature of the PEB step, the temperature and time of the second baking step, and the developing solution used in the second development process. In an exemplary process, the second baking process is preferably carried out at a temperature of at least 80° C. for a time period of about 10 to about 300 seconds. The second developing process is then carried out with an alkaline solution including about 0.5 wt % to about 5 wt % of TMAH. In addition, the alkaline solution preferably includes less than about 20 wt % of an alcohol such as ethanol, methanol, isopropanol, or a mixture thereof. Following the second development process, an ADI is preferably carried out to determine dimensions of the second patterned resist portions.

Figure 1E:
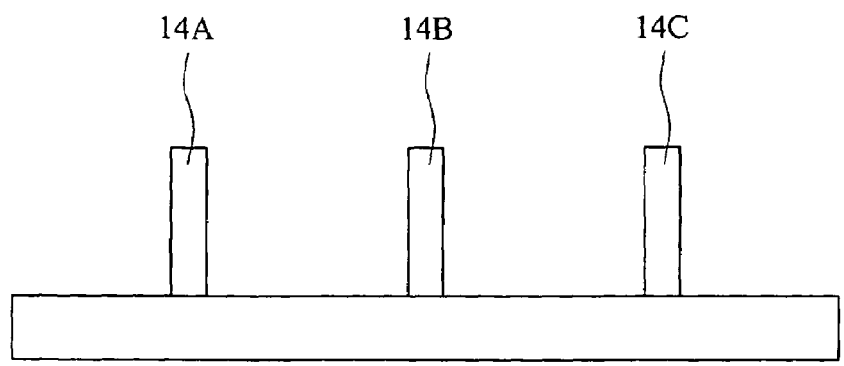

Referring to FIG. 1E, a conventional dry (plasma) trimming process is carried out to further reduce the dimensions of the resist portions e.g., 14A, 14B, and 14C. In the dry trimming process the length portion of resist line patterns is removed at about a 3:1 ratio with respect to width portions as explained further below.

Figure 2A:
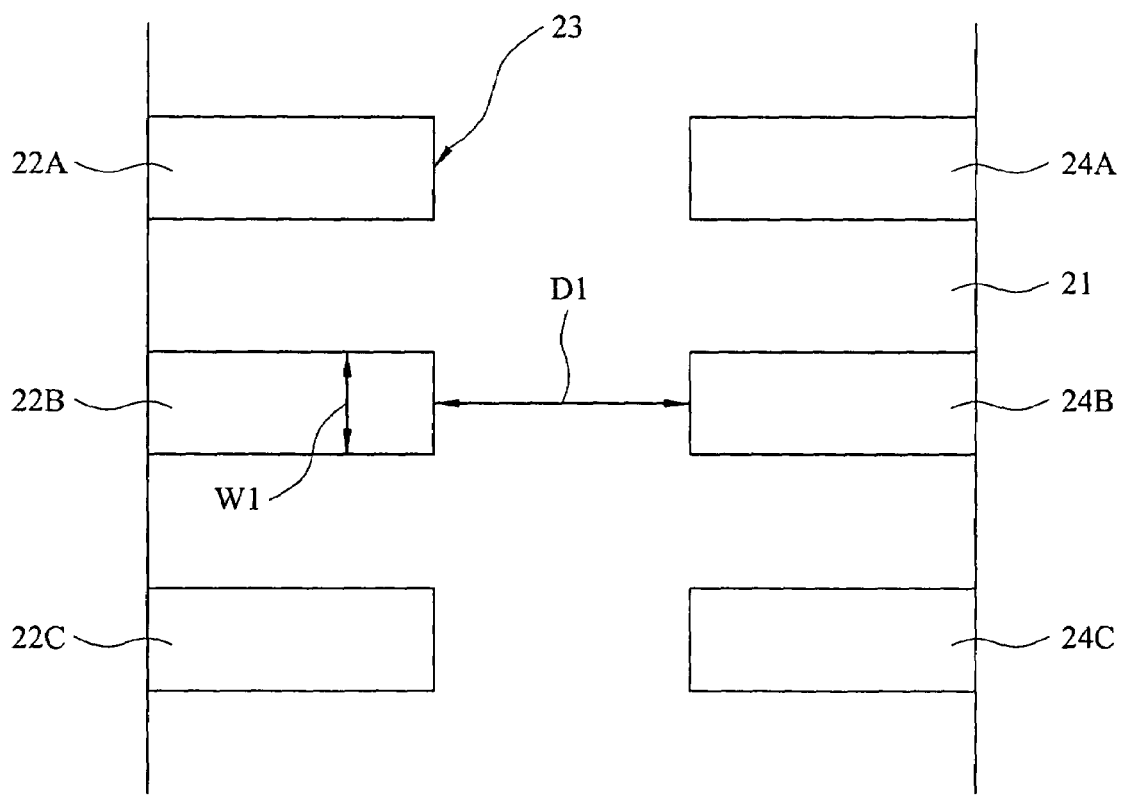
FIGS. 2A-2C are top planar views of an exemplary resist pattern at steps in manufacturing according to an embodiment of the present invention.

Referring to FIG. 2A, is shown a top planar partial view of exemplary photoresist line pattern on an underlying layer 21 including resist portions e.g., 22A, 22B, and 22C having terminal or distal portions e.g., 23 aligned opposing a second set of resist line pattern portions e.g., 24A, 24B, and 24C. FIG. 2A shows the resist line pattern portions formed following a conventional lithographic process including carrying out a post exposure baking step (PEB) followed by a first development step. A distance D1 between the distal ends of the resist line pattern portions, also referred to as a line-end-short (LES) distance, is about 75 to about 150 nm, e.g., about 100 nm. Width W1 (e.g., critical dimension (CD) portions) are from about 75 nm to about 150 nm, e.g., about 100 nm.

Figure 2B:
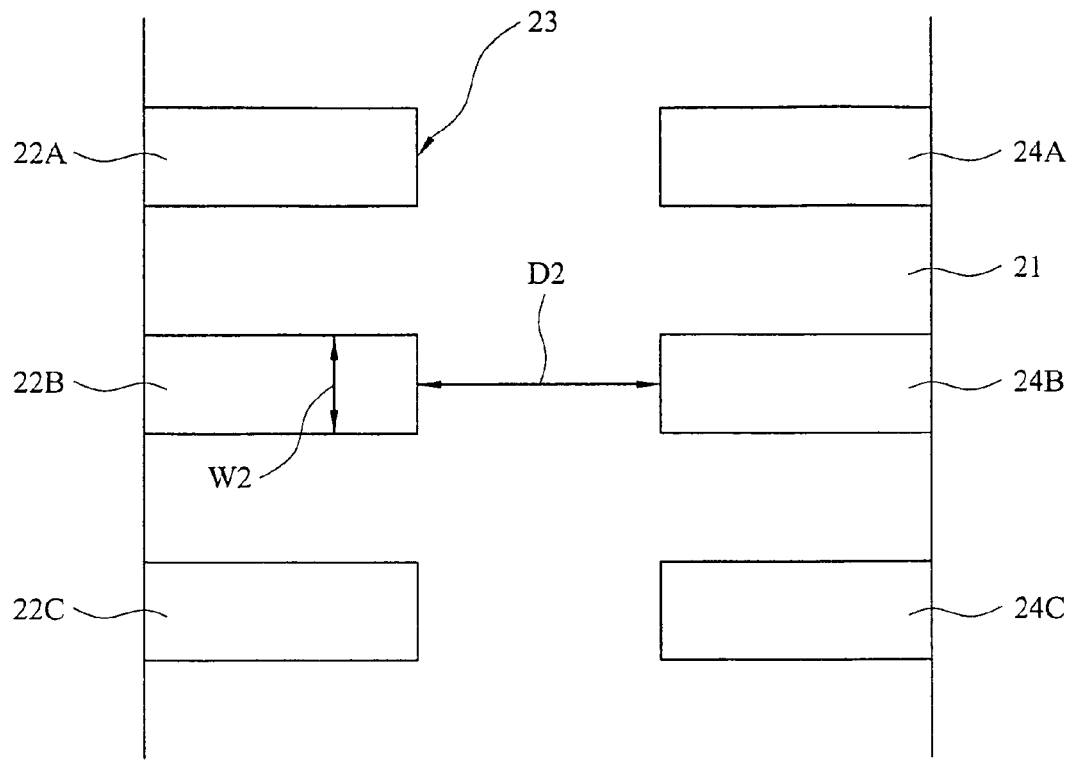

Referring to FIG. 2B, the exemplary photoresist line pattern portions are shown following a second baking step followed by a second development step according to preferred embodiments as outlined above with respect to FIGS. 1C and 1D. For example, following the second baking and development steps to substantially isotropically remove additional surface portions of the photoresist line portions and prior to a subsequent dry etch trim process, width portions e.g., W2 and LES portions D2 are formed having dimension of about 80 nm and 120 nm respectively. Thus, the additional removed surface resist portions following the second baking and development steps results in a change in the CD (width) portions (W1-W2) and LES portions (D1-D2) at about a 1:1 ratio.

Figure 2C:
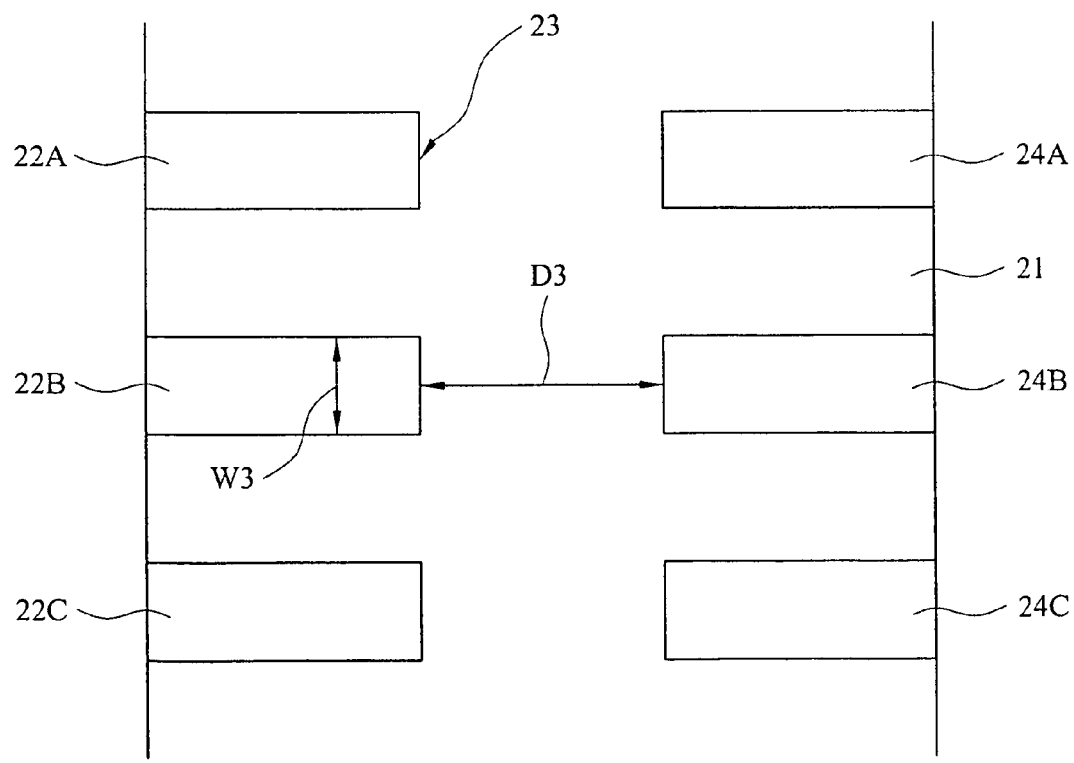

Referring to FIG. 2C, following the second baking and development steps, a conventional dry trimming (plasma etching) process is then carried out to trim the photoresist line pattern portions where the amount of additional photoresist removed (trimmed) is anisotropically removed. For example, the amount of photoresist removed from the distal end portions e.g., 23 is about 3 times the amount of photoresist removed on the width portions to form a final (target) width (CD) W3 of about 60 nm and an LES distance D3 of about 180 nm. For example, the change in CD versus LES distance is at about a ratio of 1:3 e.g., a change (reduction) of CD of about 20 nm with a change (increase) in LES distance of about 60 nm.

Advantageously, according to the present invention, by carrying out the second baking and development steps prior to the dry trimming process, the final LES distance (line spacing) is about 60 nm less (closer) in the exemplary process compared to a single (PEB) baking and develop step followed by a dry trimming process according to prior art processes. For example, by reducing the CD substantially isotropically in the second baking and development steps according to the present invention, the LES distance is not increased to the same extent during the dry trimming process. In other words, there is less of an absolute dimensional shrinkage in the line length following the dry trimming process to approach a predetermined CD.(e.g., line width) when the second baking and development process is carried out prior to the dry trimming process. For example, according to prior art processes using the same exemplary starting CD's (e.g., 100 nm) and target (final) CD's (e.g., 60 nm) and starting LES distances (e.g., 100 nm), a single baking (PEB) and development step followed by a dry trimming process results in a dimension reduction of resist pattern portions to give a final CD dimension of 60 cm and an LES distance of 240 nm. Thus, according to the present invention, better utilization of process wafer area including line spacing is accomplished while achieving reduced CD's.

Figure 3:
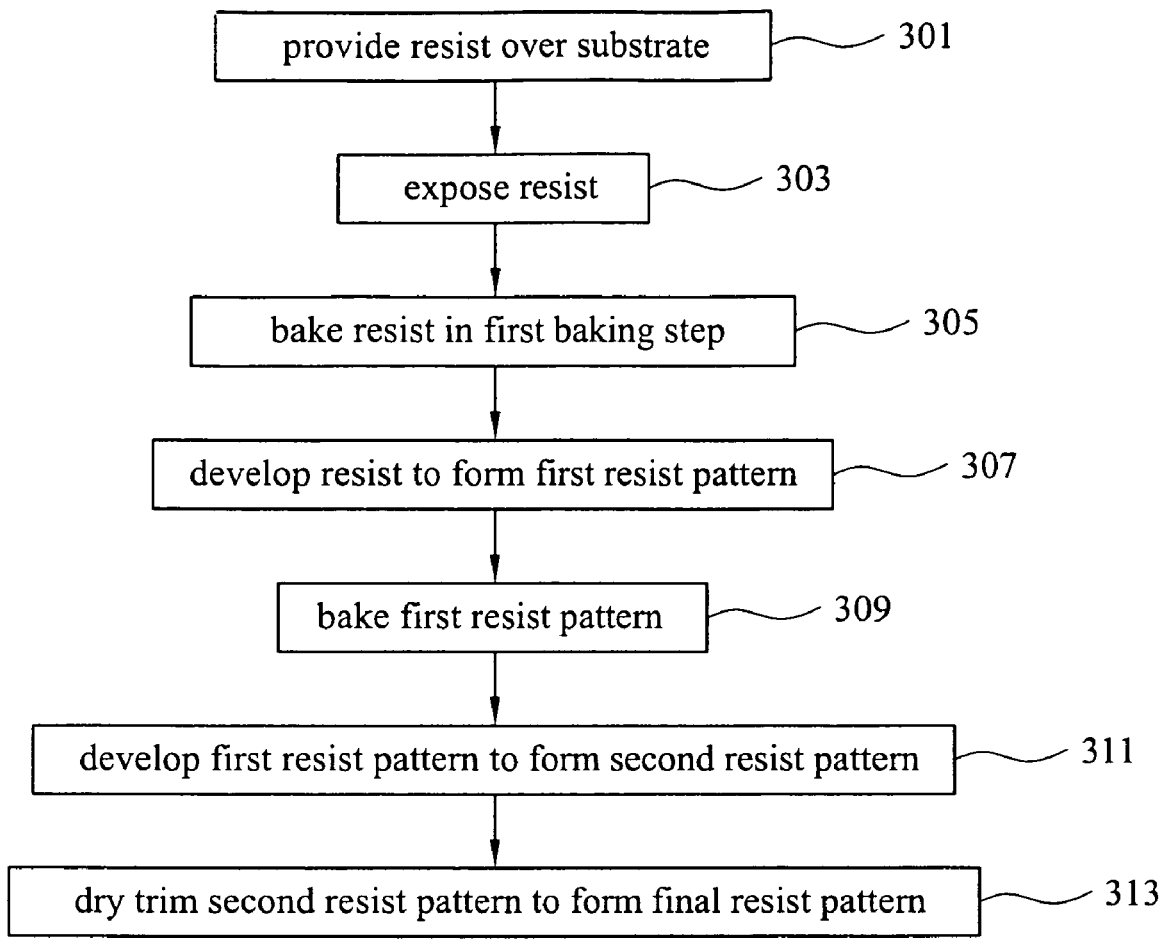
FIG. 3 is a process flow diagram including several embodiments of the present invention.

Referring to FIG. 3, is shown a process flow diagram including several embodiments of the present invention. In process 301, a substrate including an overlying photoresist layer is provided. In process 303, the photoresist is exposed with activating light through a mask. In process 305 the photoresist layer is heated in a first baking step. In process 307, the photoresist layer is developed to form a first resist pattern. In process 309 the first resist pattern is heated in a second baking step. In process 311, the first resist pattern is developed in a second development process to form a second resist pattern having isotropically reduced dimensions. In process 313, a dry trimming process is carried out to form a third (final) resist pattern having predetermined critical dimensions.

The preferred embodiments, aspects, and features of the invention having been described, it will be apparent to those skilled in the art that numerous variations, modifications, and substitutions may be made without departing from the spirit of the invention as disclosed and further claimed below.

What is claimed is:

1. A method for resist patterning comprising the steps of:
    providing a substrate comprising an overlying resist;
    exposing the resist to an activating light source;
    baking the resist in a first baking process followed by developing the resist in a first development process to form a first resist pattern;
    baking the first resist pattern in a second baking process following the first development process without exposing said first photoresist pattern to an activating light source;
    developing the first resist pattern following the second baking process in a second development process to form a second resist pattern having reduced dimensions; and,
    dry trimming the second resist pattern to form a final resist pattern with reduced dimensions compared to the second resist pattern.

2. The method of claim 1, wherein the resist comprises an acid species formed in the step of exposing.

3. The method of claim 1, wherein the resist is a CAR (chemical amplified resist) photoresist selected from the group consisting of DUV, ArF, $F_2$, and EB (electron beam) resists.

4. The method of claim 1, wherein the activating light source comprises a light generating species selected from the group consisting of KrF, ArF, $F_2$, EB and X-ray.

5. The method of claim 1, wherein the second baking process and second development process removes a portion of the first resist pattern substantially isotropically.

6. The method of claim 1, wherein the step of dry trimming removes a portion of the second resist pattern anisotropically.

7. The method of claim 1, wherein the first resist pattern comprises a line having a width and a distal end portion comprising a length.

8. The method of claim 7, wherein the second baking process and second development process removes about the same amount of the resist at the distal end portion and the width portion.

9. The method of claim 8, wherein the step of dry trimming removes a greater amount of the resist at the distal end portion compared to width portion.

10. The method of claim 1, wherein the second developing process comprises an alkaline development solution.

11. The method of claim 1, wherein the second developing process comprises an alkaline development solution with a concentration of from about 0.5 wt % to about 5 wt % tetramethyl ammonium hydroxide.

12. The method of claim 11, wherein the alkaline development solution comprises less than about 20 Wt % of an alcohol.

13. The method of claim 1, wherein the resist comprises a protecting group chemical species that is decomposed in the second baking process.

14. The method of claim 1, wherein the second baking process is carried out at a temperature of at least 80° C.

15. A method for reducing a critical dimension of a photoresist pattern to improve line spacing comprising the steps of:
    providing a substrate comprising an overlying photoresist comprising a photo-acid generator;
    exposing the photoresist to an activating light source;
    baking the photoresist in a first baking process followed by developing the resist in a first development process to form a first photoresist pattern comprising lines;
    baking the first photoresist pattern in a second baking process following the first development process without exposing said first photoresist pattern to an activating light source;
    developing the first photoresist pattern following the second baking process in a second development process to form a second photoresist pattern having substantially isotropically reduced dimensions; and,
    dry trimming the second photoresist pattern to form a final photoresist pattern with reduced dimensions compared to the second photoresist pattern.

16. The method of claim 15, wherein the first photoresist pattern comprises a line having a width and a distal end portion comprising a length.

17. The method of claim 16, wherein the second baking process and second development process removes about the same amount of the photoresist at the distal end portion and the width portion.

18. The method of claim 16, wherein the step of dry trimming removes a greater amount of the photoresist at the distal end portion compared to width portion.

19. The method of claim 15, wherein the second developing process comprises an alkaline development solution with a concentration of from about 0.5 wt % to about 5 wt % tetramethyl ammonium hydroxide.

20. The method of claim 19, wherein the alkaline development solution comprises less than about 20 Wt % of an alcohol.

21. The method of claim 15, wherein the second baking process is carried out at a temperature of at least 80° C.

* * * * *